United States Patent
Fukagawa et al.

(10) Patent No.: US 11,879,646 B2
(45) Date of Patent: Jan. 23, 2024

(54) AIR CONDITIONER, AND METHOD OF REPLACING FUNCTIONAL COMPONENT

(71) Applicant: DAIKIN INDUSTRIES, LTD., Osaka (JP)

(72) Inventors: Kazunari Fukagawa, Osaka (JP); Ryuuichi Toyota, Osaka (JP); Natsuko Kitagawa, Osaka (JP); Yuuki Takami, Osaka (JP); Yumi Aomatsu, Osaka (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 0 days.

(21) Appl. No.: 18/347,785

(22) Filed: Jul. 6, 2023

(65) Prior Publication Data

US 2023/0349584 A1 Nov. 2, 2023

Related U.S. Application Data

(63) Continuation of application No. PCT/JP2021/037287, filed on Oct. 8, 2021.

(30) Foreign Application Priority Data

Jan. 13, 2021 (JP) .................................. 2021-003751

(51) Int. Cl.
*F24F 11/88* (2018.01)
*F24F 13/22* (2006.01)
*H05K 7/10* (2006.01)

(52) U.S. Cl.
CPC ............ *F24F 11/88* (2018.01); *F24F 13/222* (2013.01); *H05K 7/10* (2013.01)

(58) Field of Classification Search
CPC ............ F24F 11/88; F24F 13/222; H05K 7/10
See application file for complete search history.

(56) References Cited

U.S. PATENT DOCUMENTS 5,364,024 A * 11/1994 Lin ........................ F24F 11/00
236/44 C
2020/0332166 A1* 10/2020 Kumakura ................ F24F 5/00
(Continued)

FOREIGN PATENT DOCUMENTS

EP 3567320 A1 11/2019
JP H06-257834 A 9/1994
(Continued)

OTHER PUBLICATIONS

International Search Report issued in corresponding International Application No. PCT/JP2021/037287 dated Nov. 30, 2021 (3 pages).
(Continued)

*Primary Examiner* — Zoheb S Imtiaz
(74) *Attorney, Agent, or Firm* — Osha Bergman Watanabe & Burton LLP

(57) ABSTRACT

An air conditioner includes a power source that supplies AC voltage and a wiring plug-in coupler connected to the power source. The wiring plug-in coupler is connected to a portion of the power source to which a first functional component, which is actuated by the AC voltage in cooperation with the air conditioner, is connected, supplies voltage to a second functional component actuated by DC voltage in cooperation with the air conditioner, and is connected with an input terminal of a converter that converts AC voltage to DC voltage and supplies the converted DC voltage to the second functional component.

16 Claims, 4 Drawing Sheets

(56) References Cited

U.S. PATENT DOCUMENTS

2021/0277563 A1\* 9/2021 Kim .................. D06F 34/14
2022/0286060 A1\* 9/2022 Uemura ................ F24F 11/30

FOREIGN PATENT DOCUMENTS

| JP | H07-167482 A | 7/1995 |
|----|--------------|--------|
| JP | 2005-37117 A | 2/2005 |
| JP | 2007-303720 A | 11/2007 |
| JP | 2013-125643 A | 6/2013 |
| JP | 2016-99022 A | 5/2016 |
| JP | 2018-190738 A | 11/2018 |
| JP | 2019-196891 A | 11/2019 |

OTHER PUBLICATIONS

Written Opinion issued in corresponding International Application No. PCT/JP2021/037287 dated Nov. 30, 2021 (4 pages).
Decision of Refusal issued in corresponding Japaanese Application No. 2021-003751 dated Jun. 14, 2022 (6 pages).
Decision to Grant a Patent issued in corresponding Japanese Application No. 2021-003751 dated Oct. 4, 2022 (5 pages).
International Preliminary Report on Patentability issued in International Application No. PCT/JP2021/037287; dated Jul. 27, 2023 (6 pages).

\* cited by examiner

AIR CONDITIONER, AND METHOD OF REPLACING FUNCTIONAL COMPONENT

TECHNICAL FIELD

Background

The present disclosure relates to an air conditioner, and a method of replacing a functional component.

Description of the Related Art

For example, PATENT LITERATURE 1 describes an air conditioner including an outdoor unit provided with a power source configured to supply AC voltage. The power source is connected with a functional component such as a fan configured to operate in cooperation with the outdoor unit, to allow supply of AC voltage from the power source to the functional component.

PATENT LITERATURE

PATENT LITERATURE 1: Japanese Laid-Open Patent Publication No. 2019-196891

SUMMARY

An air conditioner including:
a power source unit (example of the claimed power source) configured to supply AC voltage; and
a wiring plug-in coupler connected to the power source unit for supply of voltage to a second functional component configured to be actuated by DC voltage in cooperation with the air conditioner; wherein
the wiring plug-in coupler is configured to be connected with an input terminal of a converter configured to convert AC voltage to DC voltage and supply the second functional component with the converted DC voltage, and
the wiring plug-in coupler is connected to a portion of the power source unit to which a first functional component configured to be actuated by the AC voltage in cooperation with the air conditioner is connectable.

DESCRIPTION OF THE EMBODIMENTS

Embodiments will be described hereinafter with reference to the accompanying drawings.

[Air Conditioner]

Figure 1:
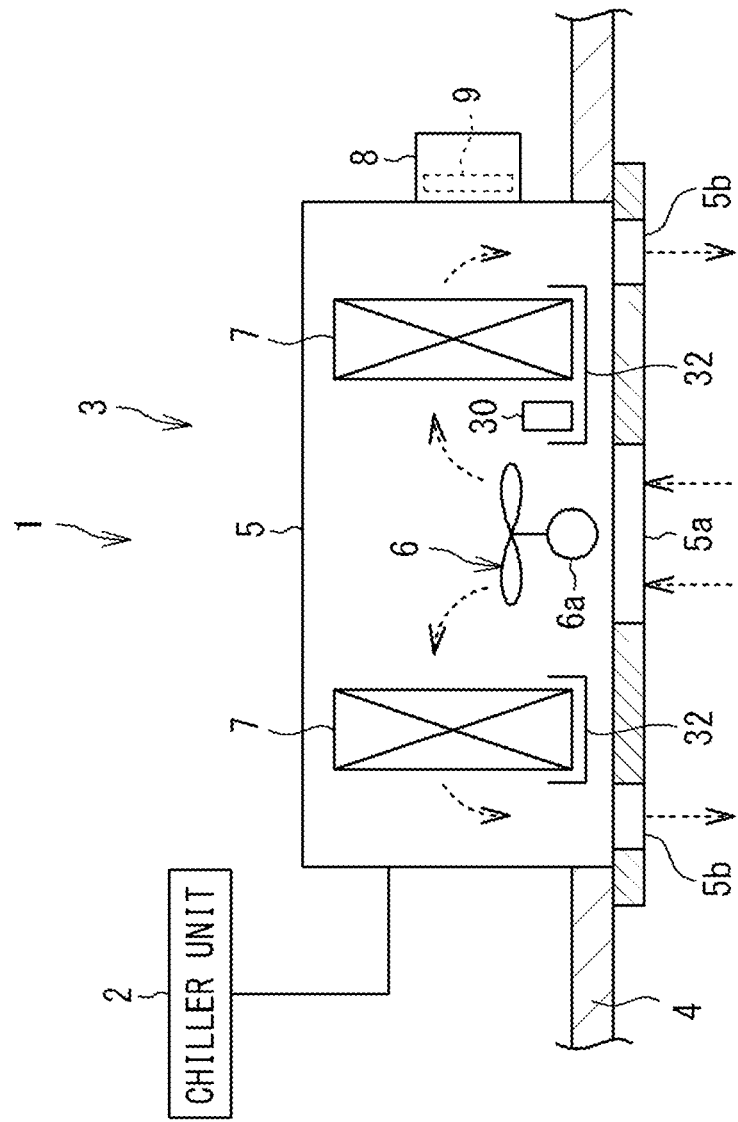
FIG. 1 is a schematic configuration diagram of an air conditioner according to one or more embodiments.

FIG. 1 is a schematic configuration diagram of an air conditioner according to one or more embodiments. An air conditioner 1 principally includes a chiller unit 2 and a fan coil unit (indoor unit) 3. The chiller unit 2 is disposed outdoors and is configured to cool or heat a heating medium.

The fan coil unit 3 is of a ceiling embedded type to be installed in an indoor ceiling wall 4.

The fan coil unit 3 causes heat exchange between the heating medium cooled or heated in the chiller unit 2 and indoor air to adjust indoor temperature and the like. The fan coil unit 3 is of an indoor power receiving type, and is supplied with voltage from an AC power source (not depicted) installed indoors. The fan coil unit 3 includes a case 5, a fan 6, a heat exchanger 7, and an electric component box 8.

The case 5 is disposed to penetrate the ceiling wall 4. The case 5 accommodates the fan 6 and the heat exchanger 7. The case 5 has a lower surface provided with an intake port 5a allowing indoor air to be imported into the case 5, and a blow-out port 5b allowing air obtained after heat exchange to blow indoors.

The fan 6 is disposed in the case 5 and above the intake port 5a. The fan 6 includes a driving fan motor 6a. When the fan motor 6a is driven, the fan 6 generates an air flow of importing indoor air from the intake port 5a into the case 5. When the fan motor 6a is driven, the fan 6 generates an air flow of blowing out, from the blow-out port 5b, indoor air that has been imported into the case 5 and has passed the heat exchanger 7. The heat exchanger 7 causes heat exchange between indoor air imported into the case 5 by the fan 6 and the heating medium.

The electric component box 8 is provided outside the case 5. The electric component box 8 accommodates a printed circuit board 9. The printed circuit board 9 is equipped with a power source circuit 10 connected to the AC power source, and a control circuit 40 (see FIG. 2). The power source circuit 10 functions as a power source unit configured to supply AC voltage. The control circuit 40 will be described in detail later.

The fan coil unit 3 is provided with a functional component configured to operate in cooperation with the air conditioner 1. One or more embodiments provide a drain pump 30 as the functional component disposed in the case 5. The drain pump 30 discharges drain water generated in the heat exchanger 7 during cooling operation of the air conditioner 1. The drain pump 30 is actuated upon detection by a first float switch 16 or a second float switch 18 to be described later. The drain pump 30 is actuated by DC voltage. The drain pump 30 has rated voltage of 5 V or the like.

[Power Source Circuit]

Figure 2:
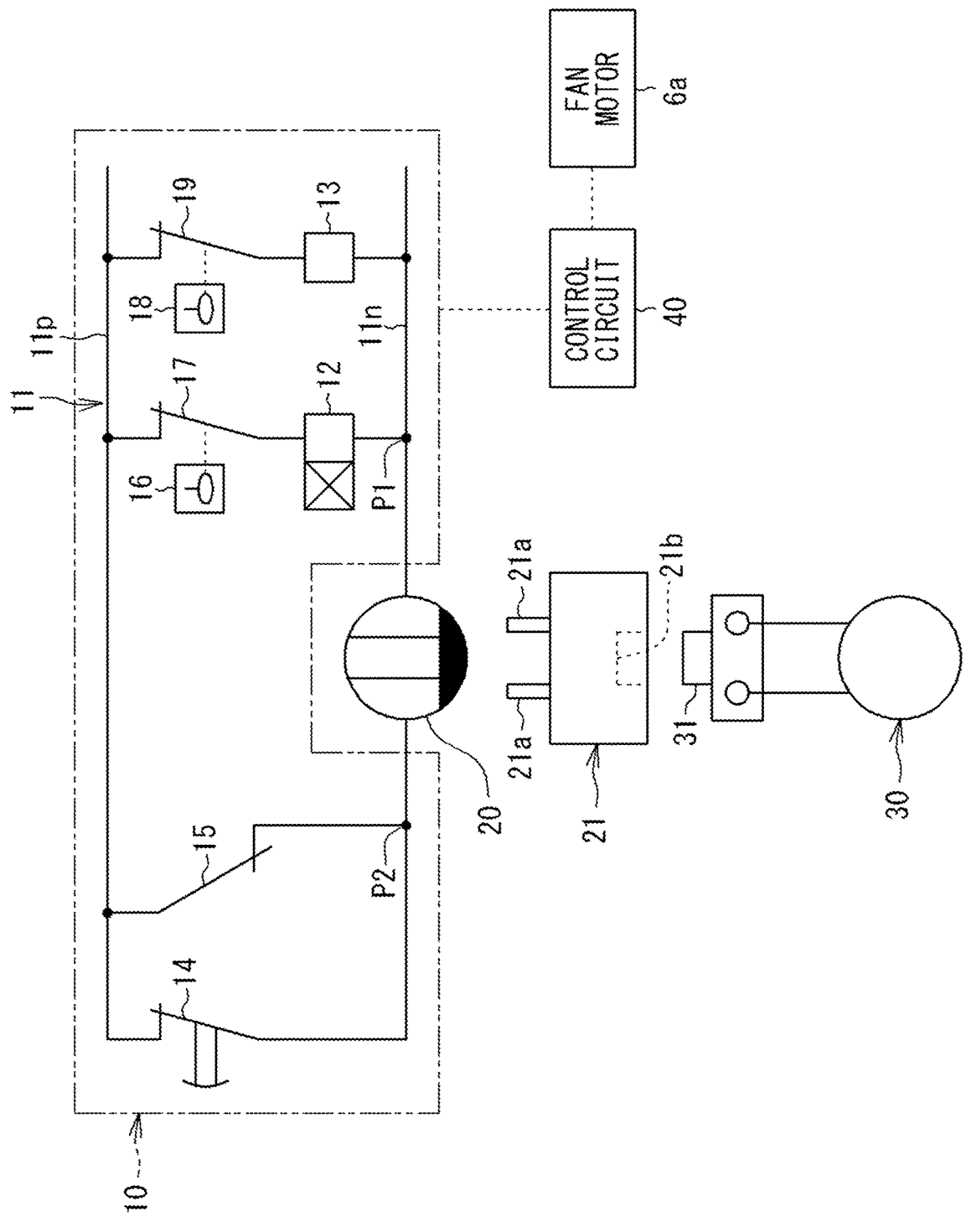
FIG. 2 is a circuit diagram of a power source circuit according to one or more embodiments.

FIG. 2 is a circuit diagram of the power source circuit 10. The power source circuit 10 includes AC wiring 11 that is supplied with AC voltage of 100 V or 200 V from the AC power source. The AC wiring 11 is constituted by a first line 11p and a second line 11n. The AC power source is connected to right ends in FIG. 2 of the first line 11p and the second line 11n. The first line 11p and the second line 11n interpose a first relay coil 12, a second relay coil 13, a contact point (b contact point) 14 of the first relay coil 12, and a contact point (b contact point) 15 of the second relay coil 13, each of which is connected in parallel.

A contact point (b contact point) 17 of the first float switch 16 is connected between the first line 11p and the first relay coil 12. The first float switch 16 detects a state where a drain pan 32 (see FIG. 1) configured to receive drain water generated in the heat exchanger 7 has a water level having reached a predetermined reference water level. A contact point (b contact point) 19 of the second float switch 18 is connected between the first line 11p and the second relay coil 13. The second float switch 18 detects a state where the water level of the drain pan 32 has reached an abnormal water level higher than the reference water level.

An electrical outlet 20 as a wiring plug-in coupler is connected between a joint portion P1 of the first relay coil 12 and a joint portion P2 of the contact point 15 on the second line 11n. For example, the electrical outlet 20 is connected to a closed-end connection terminal or a terminal block (not depicted) provided on the second line 11n. The electrical outlet 20 is provided for supply of voltage to the drain pump 30. The electrical outlet 20 is configured to receive AC voltage from the power source circuit 10 and supply AC voltage of AC 100 V or AC 200 V.

The electrical outlet 20 is connected with a converter 21 configured to covert AC voltage to DC voltage. FIG. 2 depicts the electrical outlet 20 and the converter 21 separately from each other for convenience. The converter 21 is a general-purpose AC-DC converter that is commercially available. The converter 21 includes an input terminal 21a configured to receive AC voltage, and an output terminal 21b configured to output DC voltage. The input terminal 21a is constituted by a plug to be inserted to the electrical outlet 20. The output terminal 21b is constituted by an output port of the universal serial bus (USB) standard as a general-purpose connection standard.

The output terminal 21b of the converter 21 is connected with a power source connector 31 of the drain pump 30. FIG. 2 depicts the output terminal 21b and the power source connector 31 separately from each other for convenience. The power source connector 31 is constituted by a connector according to the USB standard.

In this configuration, the first float switch 16 is in a non-detecting state of not detecting the reference water level if the water level of the drain pan 32 is less than the reference water level during cooling operation of the air conditioner 1. When the first float switch 16 is in the non-detecting state, the contact point 17 of the first float switch 16 is on and the first relay coil 12 is excited, so that the contact point 14 of the first relay coil 12 is kept off. In this state, the electrical outlet 20 is not supplied with AC voltage, and the drain pump 30 is thus not actuated.

When the water level of the drain pan 32 reaches the reference water level, the first float switch 16 detects the reference water level to turn off the contact point 17 of the first float switch 16. When the contact point 17 is turned off, the first relay coil 12 is degaussed to turn on the contact point 14 of the first relay coil 12. When the contact point 14 is turned on, the electrical outlet 20 is supplied with AC voltage, so that the drain pump 30 is supplied with DC voltage via the converter 21. Accordingly, the drain pump 30 is actuated to discharge drain water in the drain pan 32.

The second float switch 18 detects the state where the water level of the drain pan 32 reaches the abnormal water level if the drain pump 30 is not actuated due to malfunction or the like of the first float switch 16 when the water level of the drain pan 32 reaches the reference water level. Upon detection by the second float switch 18, the contact point 19 of the second float switch 18 is turned off. When the contact point 19 is turned off, the second relay coil 13 is degaussed to turn on the contact point 15 of the second relay coil 13. When the contact point 15 is turned on, the electrical outlet 20 is supplied with AC voltage, so that the drain pump 30 is supplied with DC voltage via the converter 21. Accordingly, the drain pump 30 is actuated to discharge drain water in the drain pan 32.

[Control Circuit]

The control circuit 40 is exemplarily constituted by a bimetal thermostat and a relay. The control circuit (example of the claimed controller) 40 functions as a control unit configured to start or stop supply of AC voltage to the electrical outlet 20 in cooperation with the air conditioner 1. The control circuit 40 according to one or more embodiments functions as a control unit configured to start or stop supply of AC voltage to the electrical outlet 20 in cooperation with control of the fan 6 in the fan coil unit 3.

Specifically, the control circuit 40 controls driving of the fan motor 6a, and starts supply of AC voltage to the electrical outlet 20 when driving the fan motor 6a. The control circuit 40 stops supply of AC voltage to the electrical outlet 20 when stopping driving of the fan motor 6a.

[Method of Replacing Drain Pump]

Figure 3:
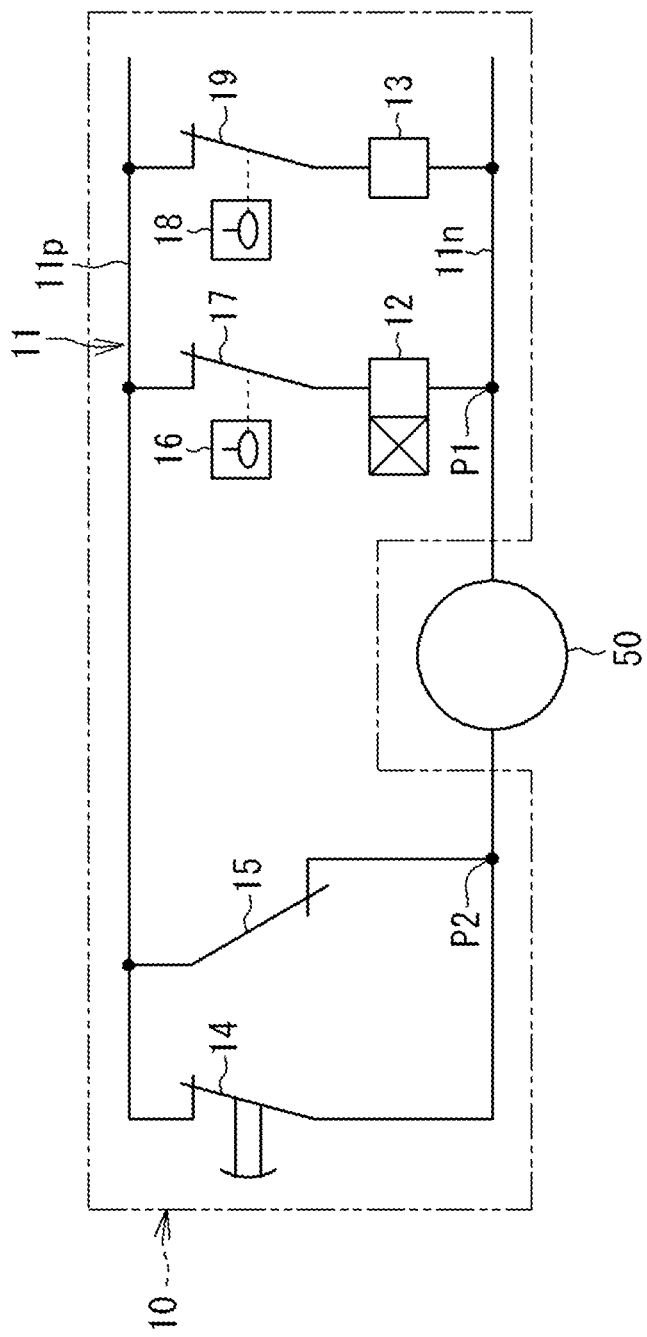
FIG. 3 is a circuit diagram of a power source circuit provided with no electrical outlet according to one or more embodiments.

FIG. 3 is a circuit diagram of the power source circuit 10 not provided with the electrical outlet 20. The power source circuit 10 depicted in FIG. 3 is provided with a drain pump 50 configured to be actuated by AC voltage. The drain pump 50 is connected between the joint portion P1 and the joint portion P2 on the second line 11n. For example, the drain pump 50 is connected to the closed-end connection terminal or the terminal block (not depicted) provided on the second line 11n.

The power source circuit 10 provided with the drain pump 50 (a first functional component) configured to be actuated by AC voltage is often included in the existing fan coil unit 3. The drain pump 50 configured to be actuated by AC voltage is lower in pump efficiency than the drain pump (a second functional component) 30 configured to be actuated by DC voltage. Accordingly, in the existing fan coil unit 3, the drain pump 50 configured to be actuated by AC voltage is replaced with the drain pump 30 configured to be actuated by DC voltage in some cases for improvement in pump efficiency. Described hereinafter is a method of replacing the drain pump.

Figure 4:
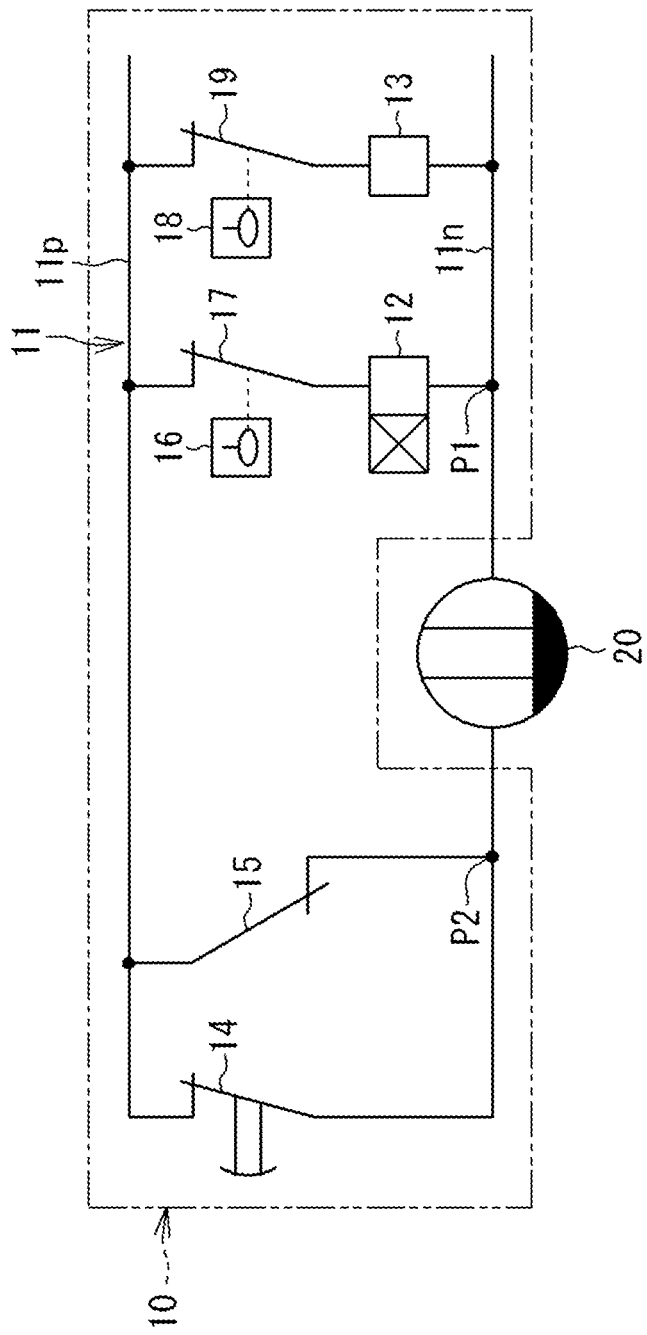
FIG. 4 is a circuit diagram of a power source circuit according to one or more embodiments in a state where a drain pump is being replaced.

From a state depicted in FIG. 3, the drain pump 50 configured to be actuated by AC voltage is replaced with the electrical outlet 20. Specifically, after the drain pump 50 connected to the second line 11n is detached, the electrical outlet 20 is disposed at a site having been provided with the drain pump 50, and the electrical outlet 20 is connected to the second line 11n as depicted in FIG. 4.

Subsequently, the input terminal 21a of the converter 21 configured to convert AC voltage to DC voltage is connected to the electrical outlet 20 as depicted in FIG. 2. Thereafter, the power source connector 31 of the drain pump 30 configured to be actuated by DC voltage is connected to the output terminal 21b of the converter 21. The drain pump 50 configured to be actuated by AC voltage and provided on the power source circuit 10 in the existing fan coil unit 3 can thus be replaced with the drain pump 30 configured to be actuated by DC voltage.

In a case where the functional component is connected to the power source configured to supply AC voltage and is configured to be actuated by AC voltage, there may be demands for replacement of the functional component with a different functional component configured to be actuated by DC voltage. It is necessary to prepare a dedicated conversion circuit configured to convert AC voltage to DC voltage in this case, failing to allow easy replacement.

One or more embodiments provide an air conditioner and a method of replacing a functional component, which allow easy connection of the functional component configured to be actuated by DC voltage to a power source unit configured to supply AC voltage.

Functional Effects of Embodiment

In the air conditioner 1 according to one or more embodiments, the electrical outlet 20 is connected to the power source circuit 10 configured to supply AC voltage, and the general-purpose converter 21 configured to convert AC voltage to DC voltage can thus be connected to the electrical outlet 20. The converter 21 can be connected with the drain pump 30 configured to be actuated by DC voltage. The drain pump 30 configured to be actuated by DC voltage can thus be easily connected to the power source circuit 10 configured to supply AC voltage via the electrical outlet 20 and the converter 21.

The control circuit 40 in the fan coil unit 3 starts or stops supply of AC voltage to the electrical outlet 20 on the power source circuit 10 in cooperation with the fan 6. When the drain pump 30 is connected to the electrical outlet 20 via the converter 21, the drain pump 30 can thus be actuated in cooperation with the fan 6.

The electrical outlet 20 can be connected with the converter 21 including the output terminal 21b according to the USB standard as the general-purpose connection standard. The drain pump 30 can thus be easily connected to the electrical outlet 20 via the output terminal 21b according to the USB standard, in the converter 21.

In the method of replacing the drain pump according to one or more embodiments, the drain pump 50 configured to be actuated by AC voltage is replaced with the electrical outlet 20 on the power source circuit 10. The electrical outlet 20 thus having replaced the drain pump 50 is connected with the drain pump 30 configured to be actuated by DC voltage via the general-purpose converter 21. The drain pump 30 configured to be actuated by DC voltage can thus be easily connected to the power source circuit 10 configured to supply AC voltage via the electrical outlet 20 and the converter 21. Accordingly, the drain pump 30 configured to be actuated by AC voltage and exerting relatively low pump efficiency can be easily replaced with the drain pump 30 configured to be actuated by DC voltage and exerting relatively high pump efficiency.

Other Modification Examples

The embodiments described above provide the air conditioner 1 including the chiller unit 2 and the fan coil unit 3. The present disclosure may alternatively provide an air conditioner including an outdoor unit and an indoor unit configured to adjust indoor temperature and the like through vapor compression refrigeration cycle operation. In this case, a functional component configured to supply DC voltage may operate in cooperation with the indoor unit or may operate in cooperation with the outdoor unit.

Examples of the functional component configured to operate in cooperation with the indoor unit include a drain pump, a louver motor, and an air quality sensor. Examples of the functional component configured to operate in cooperation with the outdoor unit include a GPS communication device. The control circuit (control unit) may be configured to start or stop supply of AC voltage to the wiring plug-in coupler in cooperation with control of the outdoor unit. With the functional component configured to operate in cooperation with the outdoor unit, the control circuit (control unit) may be configured to start or stop supply of AC voltage to the wiring plug-in coupler in cooperation with control of the outdoor unit. The control circuit should not be limited to the configuration according to the above embodiments, and may alternatively be constituted by a microcomputer including a CPU, a memory, and the like. The indoor unit and the outdoor unit may be of the indoor power receiving type or an outdoor power receiving type.

The wiring plug-in coupler should not be limited to the electrical outlet 20, and may alternatively be an attachment plug, a code connector body, a multiple power strip, or the like.

The output terminal of the converter should not limitedly comply with the USB standard, and may alternatively comply with a connection standard such as the HDMI (registered trademark), the DisplayPort, the External Serial ATA, the IEEE 1394, or the Lightning.

Although the disclosure has been described with respect to only a limited number of embodiments, those skilled in the art, having benefit of this disclosure, will appreciate that various other embodiments may be devised without departing from the scope of the disclosure. Accordingly, the scope of the disclosure should be limited only by the attached claims.

REFERENCE SIGNS LIST 1 air conditioner
3 fan coil unit (indoor unit)
6 fan
10 power source circuit (power source unit)
20 electrical outlet (wiring plug-in coupler)
21 converter
21a input terminal
21b output terminal
30 drain pump (functional component, second functional component)
40 control circuit (control unit)
50 drain pump (first functional component)

What is claimed is:
1. An air conditioner comprising:
a power source that supplies AC voltage; and
a wiring plug-in coupler that:
   is connected to the power source,
   is connected to a portion of the power source to which a first drain pump, actuated by the AC voltage in cooperation with the air conditioner, is connected,
   supplies voltage to a second drain pump actuated by DC voltage in cooperation with the air conditioner, and
   is connected with an input terminal of a converter that converts AC voltage to DC voltage and supplies the converted DC voltage to the second drain pump.

2. An air conditioner comprising:
a power source that supplies AC voltage;
a wiring plug-in coupler that:
   is connected to the power source,
   supplies voltage to a drain pump actuated by DC voltage in cooperation with the air conditioner, and
   is connected with an input terminal of a converter that converts AC voltage to DC voltage and supplies the converted DC voltage to the drain pump; and
a controller that starts or stops supply of AC voltage to the wiring plug-in coupler by the power source in cooperation with the air conditioner.

3. The air conditioner according to claim 2, further comprising:
an indoor unit including the drain pump, wherein
the controller starts or stops the supply of AC voltage to the wiring plug-in coupler by the power source in cooperation with control of the indoor unit.

4. The air conditioner according to claim 3, wherein the drain pump discharges drain water generated in the indoor unit.

5. The air conditioner according to claim 4, wherein the drain pump has rated voltage of 5 V.

6. The air conditioner according to claim 3, wherein
the indoor unit includes a fan, and
the controller starts or stops the supply of AC voltage to the wiring plug-in coupler by the power source in cooperation with control of the fan.

7. The air conditioner according to claim 1, wherein the wiring plug-in coupler is connected with the converter including an output terminal according to a USB standard for output of DC voltage.

8. A method of replacing a drain pump, comprising:
replacing a first drain pump with a wiring plug-in coupler, wherein the first drain pump is connected to a power source included in an air conditioner and is actuated by AC voltage in cooperation with the air conditioner, and the wiring plug-in coupler receives AC voltage from the power source;
connecting, to the wiring plug-in coupler, an input terminal of a converter that converts AC voltage to DC voltage; and
connecting, to an output terminal of the converter, a second drain pump actuated by DC voltage in cooperation with the air conditioner.

9. The method according to claim 8, wherein the replacing includes detaching the first drain pump and connecting the wiring plug-in coupler to a portion of the power source from which the first drain pump has been detached.

10. The air conditioner according to claim 4, wherein
the indoor unit includes a fan, and
the controller starts or stops the supply of AC voltage to the wiring plug-in coupler by the power source in cooperation with control of the fan.

11. The air conditioner according to claim 5, wherein
the indoor unit includes a fan, and
the controller starts or stops the supply of AC voltage to the wiring plug-in coupler by the power source in cooperation with control of the fan.

12. The air conditioner according to claim 2, wherein the wiring plug-in coupler is connected with the converter including an output terminal according to a USB standard for output of DC voltage.

13. The air conditioner according to claim 3, wherein the wiring plug-in coupler is connected with the converter including an output terminal according to a USB standard for output of DC voltage.

14. The air conditioner according to claim 4, wherein the wiring plug-in coupler is connected with the converter including an output terminal according to a USB standard for output of DC voltage.

15. The air conditioner according to claim 5, wherein the wiring plug-in coupler is connected with the converter including an output terminal according to a USB standard for output of DC voltage.

16. The air conditioner according to claim 6, wherein the wiring plug-in coupler is connected with the converter including an output terminal according to a USB standard for output of DC voltage.

* * * * *